(12) United States Patent
Pan et al.

(10) Patent No.: US 8,680,643 B2
(45) Date of Patent: Mar. 25, 2014

(54) JUNCTION BARRIER SCHOTTKY (JBS) WITH FLOATING ISLANDS

(75) Inventors: Ji Pan, Santa Clara, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/534,854

(22) Filed: Jun. 27, 2012

(65) Prior Publication Data

US 2012/0306043 A1   Dec. 6, 2012

Related U.S. Application Data

(62) Division of application No. 12/658,434, filed on Feb. 11, 2010, now Pat. No. 8,227,330, which is a division of application No. 11/607,583, filed on Dec. 1, 2006, now Pat. No. 7,671,439.

(51) Int. Cl.
   *H01L 29/47* (2006.01)
(52) U.S. Cl.
   USPC .................................. 257/471; 257/E29.338
(58) Field of Classification Search
   USPC .......... 257/471, 484, 486, 483, 494, E29.338, 257/E27.04, E27.068, E29.041
   See application file for complete search history.

(56) References Cited

U.S. PATENT DOCUMENTS

| | | | | |
|---|---|---|---|---|
| 4,835,580 A | * | 5/1989 | Havemann et al. | 257/478 |
| 2003/0080355 A1 | * | 5/2003 | Shirai et al. | 257/200 |
| 2004/0009643 A1 | * | 1/2004 | Blanchard | 438/268 |
| 2004/0046224 A1 | * | 3/2004 | Rossel et al. | 257/471 |

* cited by examiner

*Primary Examiner* — Selim Ahmed
(74) *Attorney, Agent, or Firm* — Bo-In Lin

(57) ABSTRACT

A Schottky diode includes a Schottky barrier and a plurality of dopant regions disposed near the Schottky barrier as floating islands to function as PN junctions for preventing a leakage current generated from a reverse voltage. At least a trench opened in a semiconductor substrate with a Schottky barrier material disposed therein constitutes the Schottky barrier. The Schottky barrier material may also be disposed on sidewalls of the trench for constituting the Schottky barrier. The trench may be filled with the Schottky barrier material composed of Ti/TiN or a tungsten metal disposed therein for constituting the Schottky barrier. The trench is opened in a N-type semiconductor substrate and the dopant regions includes P-doped regions disposed under the trench constitute the floating islands. The P-doped floating islands may be formed as vertical arrays under the bottom of the trench.

10 Claims, 7 Drawing Sheets

JUNCTION BARRIER SCHOTTKY (JBS) WITH FLOATING ISLANDS

This Patent Application is a Divisional Application of a application Ser. No. 12/658,434 filed on Feb. 11, 2010 now U.S. Pat. No. 8,227,330 and application Ser. No. 12/658,434 is a Divisional Application of application Ser. No. 11/607,583 filed on Dec. 1, 2006 now issued into U.S. Pat. No. 7,671,439. The Disclosures made in application Ser. No. 11/607,583 and Ser. No. 12/658,434 are hereby incorporated by reference.

BACKGROUND OF THE INVENTION

1. Field of the Invention

The invention relates generally to the semiconductor power devices. More particularly, this invention relates to an improved and novel manufacturing process and device configuration for providing the MOSFET device with shielded trench gates with cells provided with Schottky source contact for improving performance of high frequency power switching, H-bridge and synchronization rectification applications.

2. Description of the Related Art

As the applications of Schottky diodes become more widespread, particularly for reducing the power consumption and increasing the switching speed, it becomes even more important to improve the device configuration and manufacturing processes to reduce the production costs of the Schottky rectifying devices. One particular important consideration is the reduction of the surface areas on the semiconductor substrate occupied by the Schottky diodes. Reduction of the surface-area utilization of the Schottky diodes provides a key to reduce the manufacturing costs and to further miniaturize the size and shape of electronic devices for achieving portability and functionality enhancements. However, in order to achieve the purpose of surface utilization while maintaining current conducting areas, the' Schottky diodes are sometimes implemented by filling trenches with a barrier material. The trench Schottky diode configuration leads to another technical difficulty due to the performance limitations including the required high forward voltage VF, the low sustainable breakdown voltage BV, and the high leakage current Idss. These performance limitations often cause difficulties in applying the junction barrier Schottky (JBS) for broader and more variety of applications.

The Schottky diode has been used to replace PN diodes in many applications. The low forward drop of the Schottky diode in the forward conduction mode reduces the power dissipation of the device. The conduction of the Schottky is through majority carrier, so minority carrier charge storage effects do not occur in the switching characteristics of the device. Therefore the Schottky diode is a preferred over the PN junction diodes in many power applications. FIG. 1A shows a typical Schottky diode where a Schottky barrier metal is contacted to an n-type silicon. The P+ junctions are placed at the edge of the barrier metal contact areas to eliminate the premature breakdown of the device. The forward voltage of the diode is directly proportional to the Schottky barrier height of the metal. It is then desirable to use low Schottky barrier metal to make the diode in order to reduce the conduction loss of the diode. However, the leakage current of the Schottky in the reverse blocking mode is also determined by the Schottky barrier height. Low Schottky barrier height will give rise to higher leakage current in the reverse blocking operation of the diode.

In order to reduce the reverse leakage of the Schottky diode, P-type junctions are placed in the silicon as shown in FIG. 1B. In the reverse blocking mode, the n-silicon is at a higher potential with respect to the Schottky barrier metal. The PN junction is also reverse bias. The depletions from two adjacent p-type junctions merged and shield the surface Schottky barrier from the high reverse voltage thus reduce the leakage current of the diode. The disadvantage of the JBS is the reduced Schottky surface area from the p-type junctions. For higher breakdown voltage Schottky diode, deeper p-type junction is usually required. Deeper junction also has more lateral diffusion. The Schottky area utilization could be quite low for the high breakdown voltage JBS. An alternative way to shield the Schottky barrier from the reverse voltage is the Trench MOS Barrier Schottky as shown in FIG. 1C. With the trench Schottky barrier, the depletions from surrounding the lower portions of the trenches pinch off and shield the Schottky barrier junction on top the mesa. The shape of the trenches affects the breakdown of the dielectric in the trenches. Rounding the bottom and top corners are required to reduce the leakage of the TMBS. The rounding of the sharp corners requires extra process steps and specialized equipment and all these requirements cause an increase in the production costs.

Therefore, a need still exists in the art of implementing the Schottky diodes in the electronic device including the power semiconductor devices to provide new device configuration and manufacturing method in configuring and manufacturing the Schottky diodes to overcome and resolve the above discussed problems and limitations.

SUMMARY OF THE PRESENT INVENTION

It is therefore an aspect of the present invention to provide a new and improved Schottky diode with the junction barrier metal deposited in the trenches with dopant region disposed below the trenches that has a grading dopant profiles by carrying out a tapered dopant implant for improving the JBS performance such that the above discussed limitations and difficulties of the convention Schottky is resolved.

Another aspect of this invention is to provide new and improved Schottky device configuration with the JBS disposed in the trenches with dopant islands formed at a distance from the trench bottom and having an optimize spacing between the dopant islands such that the forward voltage may be reduced, the breakdown voltage can be increased while the leakage current Idss can also be reduced.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
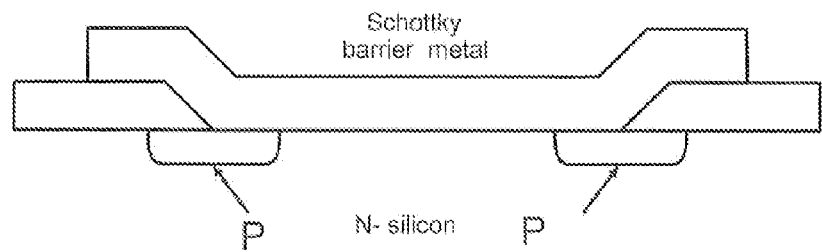
FIGS. 1A to 1C are cross sectional views of Schottky diodes disclosed in prior art disclosures.
Figure 1B:
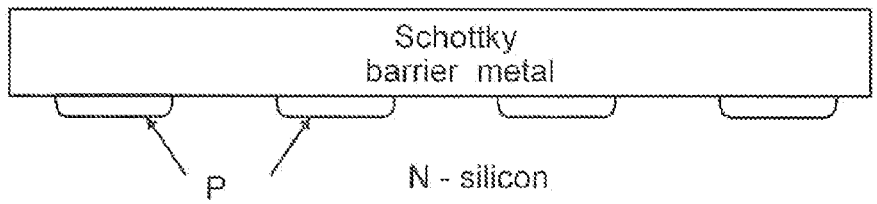
Figure 1C:
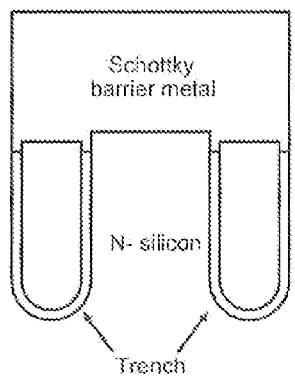
Figure 2A:
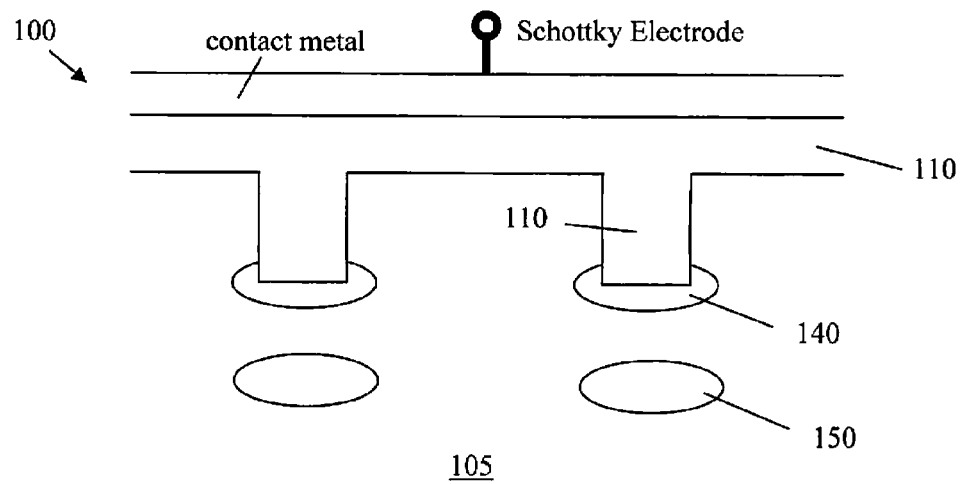
FIGS. 2A and 2B are cross sectional views of Schottky diodes with P+ floating islands of this invention.
Figure 2B:
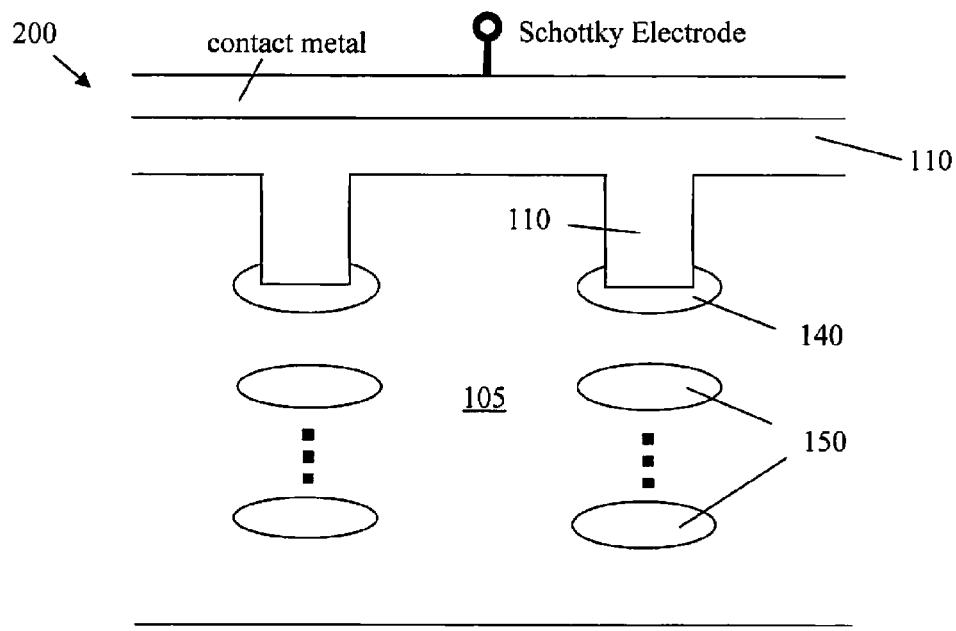

Referring to FIG. 2A for a cross sectional view of a Schottky diode 100 of this invention. The Schottky diode 100 is supported and formed in a semiconductor substrate, e.g., an N-doped silicon substrate 105. The Schottky diode 100 includes a plurality of trenches forming a plurality of semiconductor mesas. In the preferred embodiment as shown in FIG. 2 the trenches are filled with Schottky barrier metal, e.g., Ti/TiN or Tungsten metal 110, or a contact metal overlaying a Schottky barrier metal. In another preferred embodiment (not shown), at least a portion of vertical surface of semiconductor mesas is lined with Schottky barrier metal. For the purpose of preventing leakage current generated by the reverse voltage, P-dopant regions 140 are formed surrounding the bottom of the trenches. A floating P-island 150 is disposed underneath the trench bottoms. In reverse bias, the floating P island 150 forms an extra PN junction with substrate in addition to the PN junction formed between P dopant regions 140 and N substrate, the reveres bias is therefore distributed over two junctions instead of one junction as in the prior arts and the device reversed bias breakdown voltage hence increases. FIG. 2B shows an embodiment wherein pluralities of floating P islands are disposed underneath the trench bottoms thereby forming a number of extra PN junctions to divide up the total reverse bias, the breakdown voltage is therefore further increased.

Figure 3:
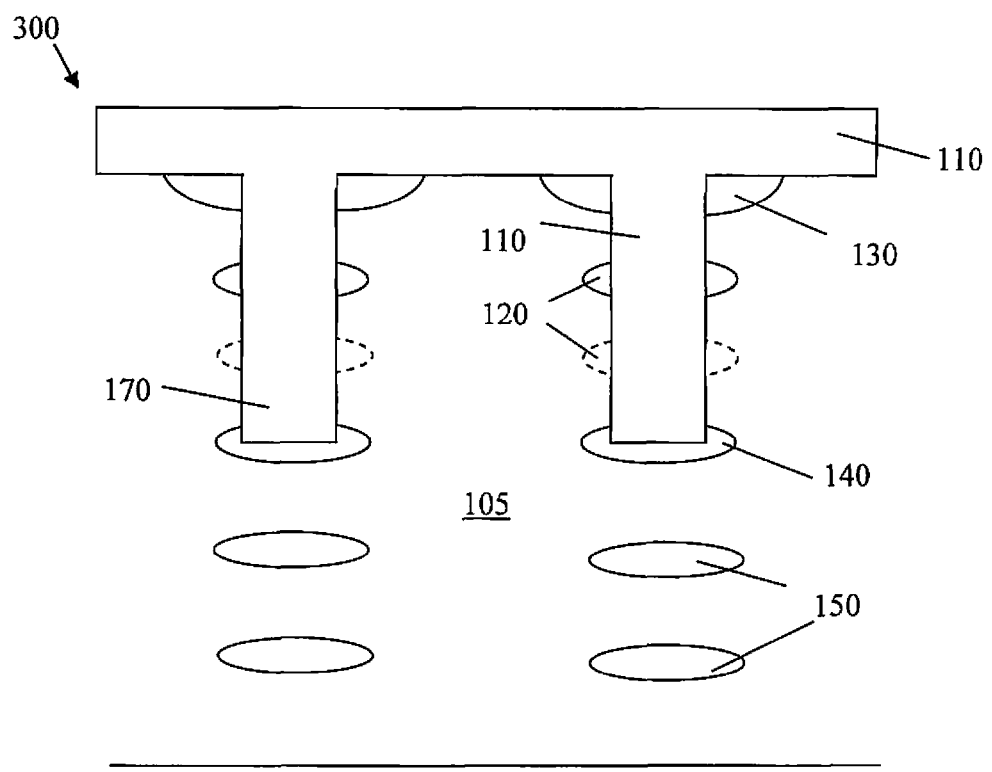
FIG. 3 is a cross sectional view of a Schottky diodes with P+ regions along the depth of trench of this invention

FIG. 3 is the cross sectional view of another embodiment of current invention. The device 300 as shown in FIG. 3 comprises a plurality of deep trenches 170 filled with Schottky barrier metal 110. In addition to the P dopant regions 140 and floating P islands 150, the device in FIG. 3 also comprises a plurality of P regions 120 surrounding the trenches along the depth of the trenches and a top P dopant region 130 surrounding the top portion of the trenches for preventing the reverse leakage current.

Figure 4:
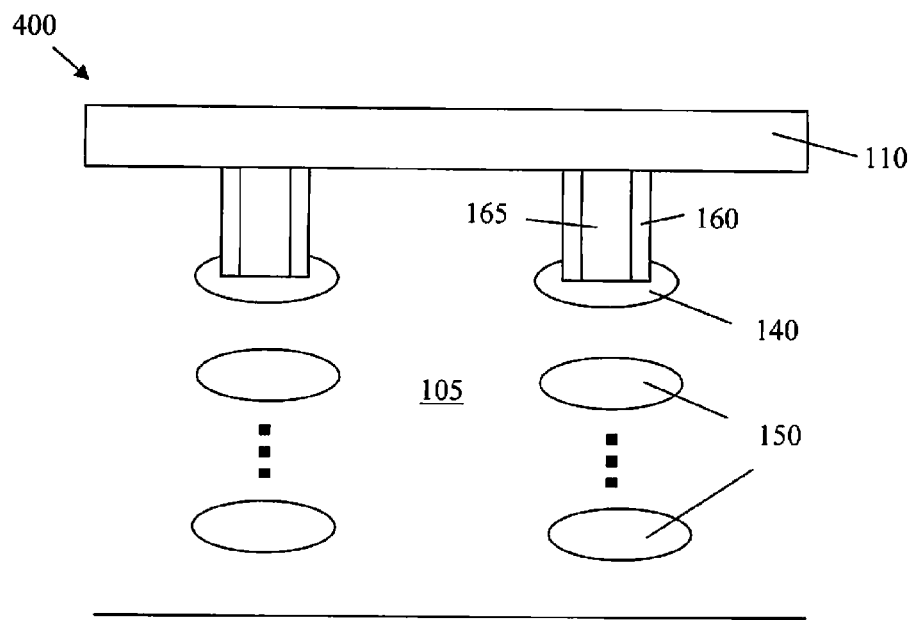
FIG. 4 is a cross sectional view of a Schottky diodes with trench side wall dielectric layer of this invention.

The device 400 as shown in FIG. 4 is similar to device 200 as shown in FIG. 2 except that, in device 400 a dialectical layer 160 is formed along the sidewall of trenches therefore no trench sidewall Schottky contact is formed. Alternatively the trench may fill with conducive material such as doped poly silicon instead of Schottky bather metal to electrically connect the P doped region 140 to Schottky contact layer 110.

Figure 5:
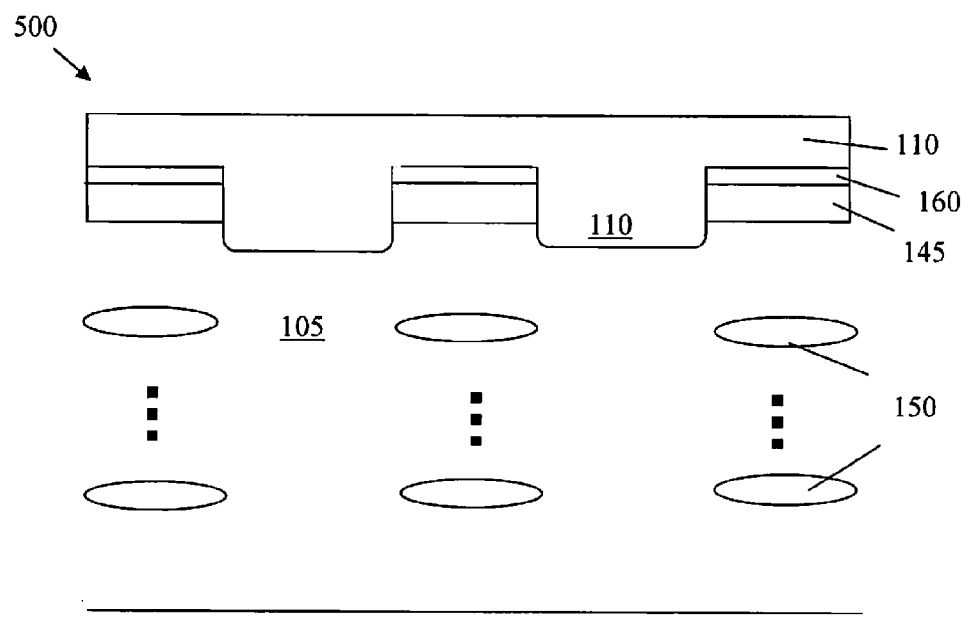
FIG. 5 is a cross sectional view of a Schottky diodes with Schottky junction forming at the trench bottom of this invention.

FIG. 5 is the cross sectional view of another embodiment 500 of current invention. The device 500 as shown in FIG. 5 comprises a plurality of shallow trenches filled with Schottky barrier metal 110. The trenches are etched through a P+ dopant layer 145 overlaying N layer 105. The trench corner is rounded to avoid sharp corner effect as Schottky junctions are formed at the trench bottom and around the corner. An optional dielectric layer 160 may be formed over the P+ layer 145 therefore P+ layer 145 only contacts with Schottky metal 110 at the edge of trench. A plurality of P+ floating islands formed under the P+ layer 145 to increase the reverse bias breakdown voltage.

Figure 6:
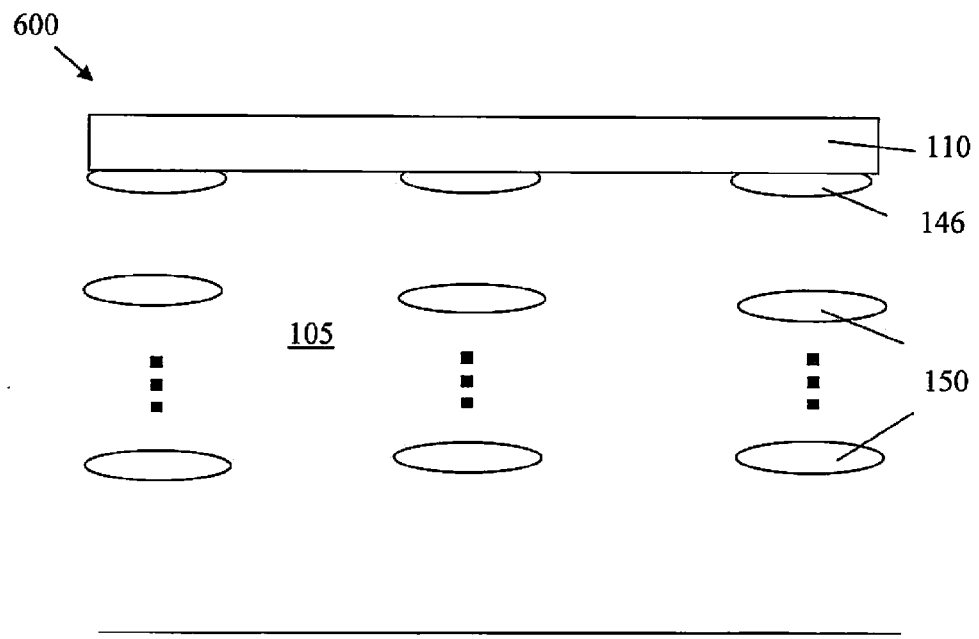
FIG. 6 is a cross sectional view of a planar Schottky diodes of this invention.

FIG. 6 is the cross sectional view of another embodiment 600 of current invention. The device 600 is a planar device. In addition to the P+ regions 146 formed on top of substrate in contact with Schottky junction barrier metal 110, the device further comprises a plurality of P+ floating islands under each surface P+ region 146 to enhance reverse breakdown voltage.

Figure 7A:
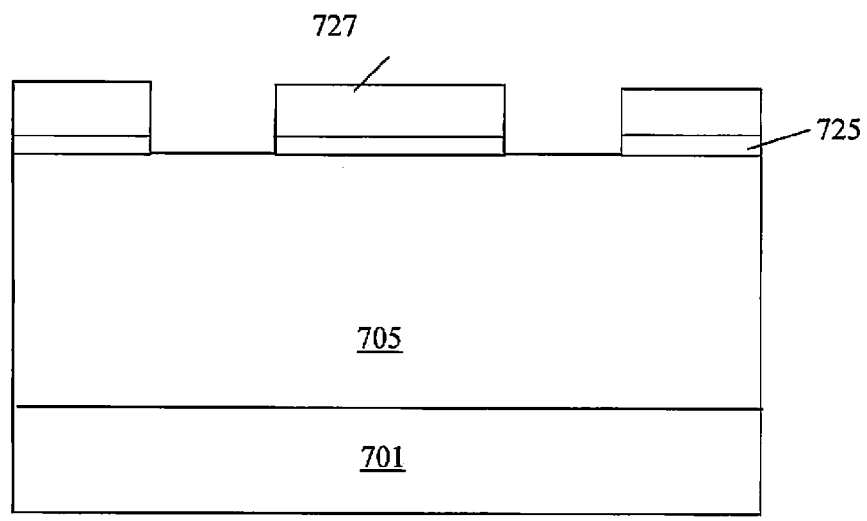
FIGS. 7A to 7D are a serial cross sectional views for describing the manufacturing processes to manufacture a Schottky device of FIG. 2A.
Figure 7B:
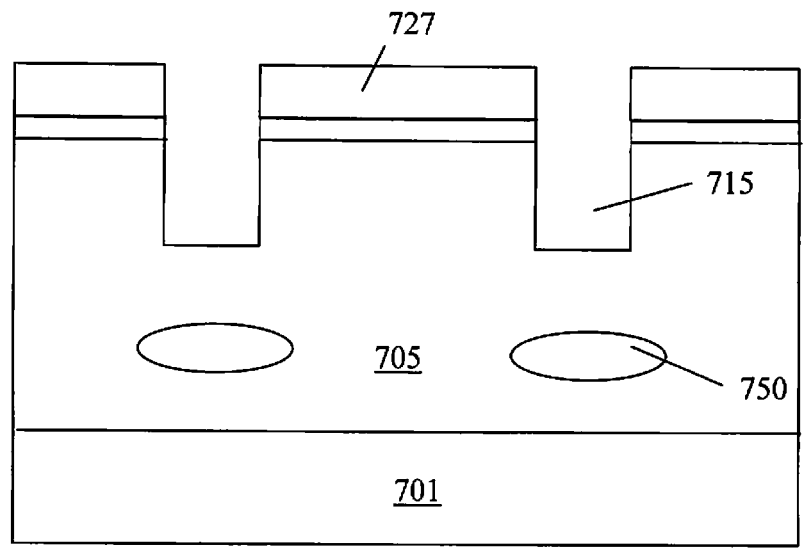
Figure 7C:
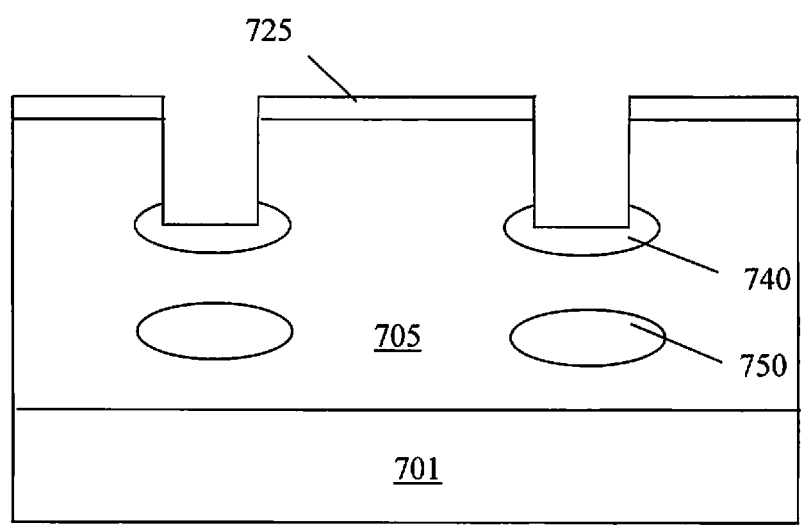
Figure 7D:
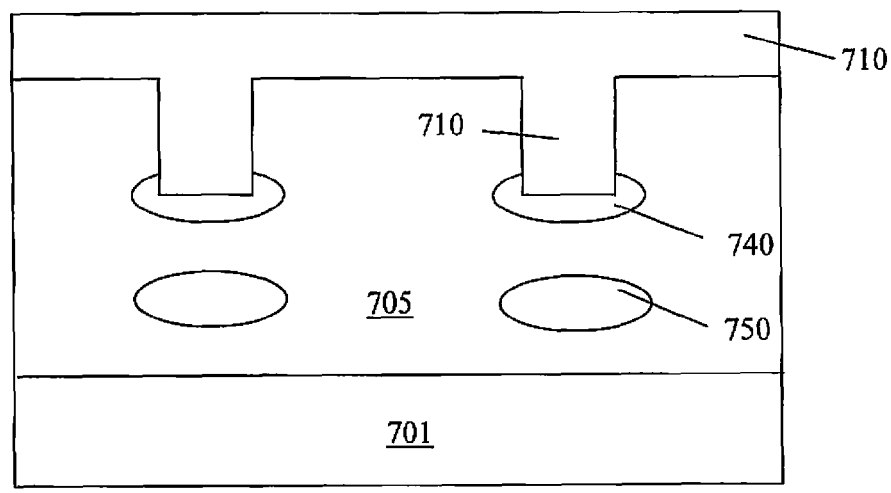

FIGS. 7A-7D are the cross sectional views of process of making a device 100 as shown in FIG. 2A. In FIG. 7A the process starts with an N type Epi wafer with an N+ substrate 701 in the bottom and a N– Epi layer 705 on the top. In one embodiment the N dopant concentration in Epi layer 705 is adjusted to around 1E16 /cm³ for a 30V device (breakdown) device. An oxide layer 725 may be formed on top of Epi layer 705 and a mask 727 is applied to etch off a portion of oxide layer 725. In FIG. 7B trenches 715 are etched through the mask 727 into the Epi layer to a predetermined depth followed by a high energy P type implant to form P+ regions 750. Multiple P+ floating islands 750 at deferent depth may be formed by multiple implantations of Boron ions with dosages ranging from 1E11 to 1E16 at energy level from 60 KeV to 1000 KeV. In one embodiment, the Boron ions with a dosage of 5E11 is implanted at the energy level of 300 KeV to form a P+ region 750 about 0.85 µm under the trench bottom. In FIG. 7C a lower energy implant is carried out to form the P+ region 740. In one embodiment $BF_2$ ions are implanted with an ion implanting energy of 60 KeV. This step may be accomplished at the same time the contact implant is carried in the case when the Schottky device is integrated with other functional circuit, such as a vertical DMOS. The oxide layer 725 is then removed. In FIG. 7D, Schottky barrier metal such as Ti/TiN or Tungsten is deposit to form the anode electrode. Alternatively a silicidation process may be carried out after the deposition of a thin layer of Schottky barrier metal followed by the deposition of a thick contact metal layer. The process is completed with a step of depositing a cathode electrode on the bottom surface of the substrate 701.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A Schottky diode comprising:
a plurality of trenches opened in a semiconductor substrate of a first conductivity type with a Schottky barrier material disposed in the trenches;
a plurality of dope regions of a second conductivity type disposed under the trenches as floating islands in the semiconductor substrate as vertically implanted dopant regions through the trenches wherein each of the floating islands having a width substantially the same or slightly broader than a width of the trenches and substantially in vertical alignment with the trenches; and
the plurality of doped regions of the second conductivity type further surrounded trench sidewalls of the trenches disposed immediately below a top surface of the semiconductor substrate and also at several vertical locations along the trenches.

2. The Schottky diode of claim 1 further comprising:
the semiconductor substrate of the first conductivity type is a N-type semiconductor substrate and the plurality of doped regions are P-type dopant regions vertically implanted in the N-type semiconductor substrate.

3. The Schottky diode of claim 1 wherein:
said Schottky barrier material metal further lining a bottom surface of said trenches forming a Schottky junction on said trench bottom surface.

4. The Schottky diode of claim 1 further comprising:
a dielectric layer disposed along sidewalls of said trench.

5. The Schottky diode of claim 1 wherein:
the trenches opened in said N-type semiconductor substrate are filled with a Schottky barrier material composed of Ti/TiN.

6. The Schottky diode of claim 1 wherein:
the trenches opened in said N-type semiconductor substrate are filled with a Schottky barrier material composed of a tungsten metal.

7. The Schottky diode of claim 1 wherein:
the trenches opened in the semiconductor substrate further having sidewall lined with the Schottky barrier material.

8. The Schottky diode of claim 1 wherein:
the semiconductor substrate of the first conductivity type is a P-type semiconductor substrate and the plurality of doped regions are N-type dopant regions vertically implanted in the P-type semiconductor substrate.

9. The Schottky diode of claim 1 further comprising:
a contact metal covering and contacting said Schottky barrier material disposed in said trenches to function as an electrode for said Schottky diode.

10. The Schottky diode of claim 1 further comprising:
a bottom doped region of a second conductivity type in said semiconductor substrate of a first conductivity type surrounding bottom corners of said trenches.

* * * * *